(12) United States Patent
Biebersdorf et al.

(10) Patent No.: US 9,423,082 B2
(45) Date of Patent: Aug. 23, 2016

(54) LIGHTING DEVICE

(75) Inventors: Andreas Biebersdorf, Regensburg (DE);
Reiner Windisch, Pettendorf (DE);
Krister Bergenek, Regensburg (DE)

(73) Assignee: OSRAM GMBH, Munich (DE)

( * ) Notice: Subject to any disclaimer, the term of this patent is extended or adjusted under 35 U.S.C. 154(b) by 308 days.

(21) Appl. No.: 14/130,681

(22) PCT Filed: Jun. 25, 2012

(86) PCT No.: PCT/EP2012/062244
§ 371 (c)(1),
(2), (4) Date: Jan. 3, 2014

(87) PCT Pub. No.: WO2013/004538
PCT Pub. Date: Jan. 10, 2013

(65) Prior Publication Data
US 2014/0133148 A1  May 15, 2014

(30) Foreign Application Priority Data

Jul. 4, 2011 (DE) .......................... 10 2011 078 572

(51) Int. Cl.
*F21K 99/00* (2016.01)
*H01L 25/075* (2006.01)
(Continued)

(52) U.S. Cl.
CPC .............. *F21K 9/56* (2013.01); *H01L 25/0753* (2013.01); *H01L 33/507* (2013.01); *H01L 33/58* (2013.01); *H01L 2924/0002* (2013.01)

(58) Field of Classification Search
CPC .............................. F21K 9/56; H01L 25/0753
See application file for complete search history.

(56) References Cited

U.S. PATENT DOCUMENTS 7,208,769 B2  4/2007  Guenther et al.
8,828,753 B2 *  9/2014  Ebe .................. H01L 33/50
257/E21.499

(Continued)

FOREIGN PATENT DOCUMENTS

DE   102004021233 A1   12/2005
JP   2007-227679 A   9/2007

(Continued)

OTHER PUBLICATIONS

German search report based on Application No. 10 2011 078 572.8 (6 Pages) dated Aug. 6, 2015 (Reference Purpose Only).

(Continued)

*Primary Examiner* — David V Bruce
(74) *Attorney, Agent, or Firm* — Viering, Jentschura & Partner mbB

(57) ABSTRACT

A lighting device may include: a carrier having a mounting surface, at least one luminescence diode chip having, at its side facing away from the carrier, a radiation exit surface, through which electromagnetic radiation generated in the luminescence diode chip during operation emerges at least partly, at least one optical body designed in a radiation-transmissive fashion, and a shaped body including a phosphor, wherein each luminescence diode chip is fixed to the mounting surface on the carrier, each optical body is fixed to the radiation exit surface of an assigned luminescence diode chip, the shaped body encloses each optical body in a positively locking manner at a side surface of the optical body, and the phosphor converts at least part of the electromagnetic radiation generated in at least one of the luminescence diode chips during operation.

20 Claims, 3 Drawing Sheets

(51) Int. Cl.
  *H01L 33/50*  (2010.01)
  *H01L 33/58*  (2010.01)

(56) References Cited

U.S. PATENT DOCUMENTS

| | | |
|---|---|---|
| 2005/0242355 A1 | 11/2005 | Guenther et al. |
| 2006/0145172 A1* | 7/2006 | Su .......................... H01L 33/58 257/98 |
| 2007/0257270 A1 | 11/2007 | Lu et al. |
| 2008/0111141 A1 | 5/2008 | Li et al. |
| 2010/0081218 A1 | 4/2010 | Hardin |
| 2010/0123855 A1 | 5/2010 | Shin |
| 2010/0165600 A1* | 7/2010 | Ku .......................... F21K 9/00 362/84 |
| 2010/0328923 A1 | 12/2010 | Shaikevitch |
| 2011/0006331 A1 | 1/2011 | Shaikevitch |
| 2011/0309390 A1 | 12/2011 | Liu et al. |

FOREIGN PATENT DOCUMENTS

| | | |
|---|---|---|
| WO | 2007049176 A1 | 5/2007 |
| WO | 2010102576 A1 | 9/2010 |

OTHER PUBLICATIONS

International Search Report of PCT/EP2012/062244 dated Feb. 8, 2013.
Chinese Office Action based on Application No. 201280033260.8(7 Pages and 10 pages of English translation) dated Dec. 3, 2015 (Reference Purpose Only).

* cited by examiner

LIGHTING DEVICE

RELATED APPLICATIONS

The present application is a national stage entry according to 35 U.S.C. §371 of PCT application No.: PCT/EP2012/062244 filed on Jun. 25, 2012, which claims priority from German application No.: 102011078572.8 filed on Jul. 4, 2011, and is incorporated herein by reference in its entirety.

TECHNICAL FIELD

A lighting device is specified.

BACKGROUND

The document U.S. Pat. No. 7,208,769 describes a lighting device.

SUMMARY

Various embodiments provide a lighting device which has an improved thermal behavior.

In accordance with at least one embodiment of the lighting device, the lighting device includes a carrier having a mounting surface. The carrier can be a connection carrier, for example, which is designed for mechanically carrying and making electrical contact with components of the lighting device. By way of example, the carrier is a circuit board or a printed circuit board. Furthermore, the carrier can be a metal-core circuit board. The carrier has at its top side, for example, a mounting surface provided for receiving components of the lighting device. By way of example, components of the lighting device can be fixed to the mounting surface by means of adhesive bonding or soldering.

In accordance with at least one embodiment of the lighting device, the lighting device includes at least one luminescence diode chip. The luminescence diode chip is, for example, a light emitting diode chip or a laser diode chip. The luminescence diode chip has, at its side facing away from the carrier, a radiation exit surface, through which electromagnetic radiation generated in the luminescence diode chip during operation emerges at least partly. In this case, it is possible for a large part of the electromagnetic radiation generated by the luminescence diode chip during operation to emerge through said radiation exit surface, which is formed for example by a main surface at the top side of the luminescence diode chip.

The lighting device may include, in particular, two or more luminescence diode chips. In this case, it is possible for all the luminescence diode chips of the lighting device to be constructed in an identical fashion. By way of example, all the luminescence diode chips of the lighting device then emit UV radiation and/or blue light during operation. Furthermore, it is possible for the lighting device to include luminescence diode chips of different designs. By way of example, the lighting device may then include luminescence diode chips which emit UV radiation and/or blue light and luminescence diode chips which emit red or differently colored light during operation.

In accordance with at least one embodiment of the lighting device, the lighting device includes at least one optical body designed in a radiation-transmissive fashion. The optical body is designed to transmit at least part of the electromagnetic radiation generated by the luminescence diode chips during operation. That is to say that at least part of said radiation enters into the optical body and also emerges again from the optical body. In this case, the optical body may be designed in a transparent, radiation-scattering and/or radiation-converting fashion at least in places.

In accordance with at least one embodiment of the lighting device, the lighting device includes a shaped body including a phosphor. The phosphor includes at least one luminescence conversion material designed in particular partly to absorb electromagnetic radiation generated by one of the luminescence diode chips and to re-emit electromagnetic radiation in particular having longer wavelengths. In this case, the phosphor can be embedded into a matrix material of the shaped body. The optical body can be formed with a plastics material, a glass or a ceramic material. The matrix material may then consist of one of said materials, for example.

In accordance with at least one embodiment of the lighting device, each luminescence diode chip of the lighting device is fixed to the mounting surface on the carrier. In this case, each luminescence diode chip can be fixed to the carrier for example at the mounting surface by means of adhesive bonding or soldering. The luminescence diode chips are in particular mechanically fixed to the carrier and electrically conductively connected to the carrier.

In accordance with at least one embodiment of the lighting device, each optical body is fixed to the radiation exit surface of an assigned luminescence diode chip. The optical body completely covers for example the radiation exit surface of the assigned luminescence diode chip, that is to say of the luminescence diode chip to which the optical body is fixed. In this way, a large part of the electromagnetic radiation emerging through the radiation exit surface enters into the optical body. In this case, it is possible for a further material, for example a connecting material such as an adhesive or a so-called "index matching gel", to be arranged between optical body and luminescence diode chip. Furthermore, it is possible for the optical body to be fixed to the assigned luminescence diode chip in a manner free of connecting medium. The optical body may then be fixed to the radiation exit surface of the assigned luminescence diode chip for example by means of an application method such as injection molding or transfer molding.

In accordance with at least one embodiment of the lighting device, the shaped body encloses each optical body in a positively locking manner at a side surface of the optical body. That is to say that the optical bodies of the lighting device can be in direct contact with the shaped body at at least one side surface, preferably at each side surface, and are enclosed by the shaped body in a positively locking manner. The optical body may be enclosed by the shaped body for example by means of injection molding or casting. The shaped body then in particular directly adjoins the side surfaces of the luminescence diode chips of the lighting device.

In other words, the optical bodies of the lighting device may be encapsulated with the shaped body by casting or injection molding. The lighting device then includes in particular a single shaped body, which encloses all the optical bodies of the lighting device in a positively locking manner. For the optical bodies it is furthermore possible for a top surface facing away from the assigned luminescence diode chip also to be enclosed by the shaped body in a positively locking manner.

In accordance with at least one embodiment of the lighting device, the phosphor converts at least part of the electromagnetic radiation generated in at least one of the luminescence diode chips during operation. That is to say that at least the electromagnetic radiation of one of the luminescence diode chips of the lighting device is wavelength-converted by the phosphor introduced in the shaped body, in particular to electromagnetic radiation having longer wavelengths (so-called "down-conversion").

In accordance with at least one embodiment of the lighting device, the lighting device includes a carrier having a mounting surface, at least one luminescence diode chip having, at its side facing away from the carrier, a radiation exit surface, through which electromagnetic radiation generated in the luminescence diode chip during operation emerges at least partly, at least one optical body designed in a radiation-transmissive fashion, and a shaped body including a phosphor. In this case, each luminescence diode chip is fixed to the mounting surface on the carrier, each optical body is fixed to the radiation exit surface of an assigned luminescence diode chip, the shaped body encloses each optical body at side surfaces of the luminescence diode chips and of the optical bodies, and the phosphor converts at least part of the electromagnetic radiation generated in at least one of the luminescence diode chips during operation.

In this case, the lighting device described here is based on the insight, inter alia, that the described optical bodies which are fixed to the radiation exit surface of an assigned luminescence diode chip prevent the arising of so-called hot spots, that is to say regions of increased temperature, at the outer surface of the shaped body facing away from the carrier. In particular, the optical bodies contribute to the shaped body having, at said outer surface, a temperature that is substantially uniform over the entire outer surface. The optical bodies alter the distribution of the electromagnetic radiation generated by the assigned luminescence diode chip in the far field, which makes it possible to prevent an intensified absorption of electromagnetic radiation in the region of the hot spots of the shaped body.

In accordance with at least one embodiment of the lighting device, the shaped body encloses each luminescence diode chip of the lighting device in a positively locking manner at a side surface of the luminescence diode chip. In particular, it is possible for the shaped body to enclose each luminescence diode chip in a positively locking manner at all the side surfaces of the luminescence diode chip. The luminescence diode chip can be enclosed by the shaped body for example by means of injection molding or casting. The shaped body then in particular directly adjoins the side surfaces of the luminescence diode chips of the lighting device.

At the same time, however, the luminescence diode chips and/or the optical bodies can be surrounded by a shaped body including a phosphor, that is to say that the luminescence diode chips are enclosed with a so-called "volume potting". Such a "volume potting" realized by the shaped body is distinguished by an increased efficiency by comparison with the direct application of a phosphor layer to the radiation exit surface of a luminescence diode chip. In this case, the increase in efficiency is in the range of at least 2 to at least 5%. The reason for this increase in efficiency can be seen, in particular, in the fact that with the use of a shaped body including a phosphor, less light is backscattered into the luminescence diode chip than is the case when a phosphor layer is directly applied to the radiation exit surface of the luminescence diode chip. The use of an optical body at the radiation exit surface of a luminescence diode chip further reduces the probability of light being backscattered into the luminescence diode chip.

In accordance with at least one embodiment of the lighting device, an optical body is assigned one-to-one to each luminescence diode chip. That is to say that, in accordance with this embodiment, each luminescence diode chip includes an optical body arranged at the radiation exit surface of the luminescence diode chip, wherein exactly one luminescence diode chip is assigned to each optical body, and vice versa.

In accordance with at least one embodiment of the lighting device, the thickness of the optical body in a direction for example perpendicular to the radiation exit surface of the luminescence diode chip is greater than the thickness of the luminescence diode chip. In particular, the thickness of the optical body can be 500 μm or more.

In accordance with at least one embodiment of the lighting device, at least two optical bodies of the lighting device differ in terms of form and/or material composition. That is to say that the optical bodies of the lighting device need not be constructed in an identical fashion, rather they can be adapted to requirements made of the lighting device. By way of example, different optical bodies can be assigned to different types of luminescence diode chips. Furthermore, it is possible for different optical bodies also to be assigned to luminescence diode chips constructed in an identical fashion, in order for example to set a desired light distribution and/or emission characteristic of the lighting device.

In this case, it is possible for at least one of the optical bodies to be designed in a transparent fashion at least in places, that is to say that the optical body in this case is designed to be transparent and not hazy or milky. In particular, the optical body then has a haze value of <0.5.

The haze value is also designated as haziness. The haze value is defined for transmission, for example, as the quotient of that proportion of radiation which is scattered by an angle of more than 2.5° when passing through a medium and the total radiation transmitted through the medium. In other words, the optical body is then transparent or virtually transparent.

In accordance with at least one embodiment of the lighting device, at least one of the optical bodies is designed in a radiation-scattering fashion at least in places.

In this case, the optical body can be formed for example with a matrix material, such as a plastic or a glass, into which scattering centers are introduced, at which the electromagnetic radiation passing through is scattered.

In accordance with at least one embodiment of the lighting device, at least one of the optical bodies is designed in a pyramidal or prismatic fashion. That is to say that at least one of the optical bodies is designed to be triangular in cross section. Such an optical body is suitable for directing as much electromagnetic radiation of the assigned luminescence diode chip as possible toward the side, that is to say toward the shaped body. Particularly efficient conversion of electromagnetic radiation by the phosphor of the shaped body can be effected in this way.

Furthermore, it is possible for at least one of the optical bodies to be designed in a hemispherical or lens-shaped fashion. That is to say that the optical body then has curved rather than straight side surfaces.

In accordance with at least one embodiment of the lighting device, at least one of the optical bodies of the lighting device is free of the shaped body at its top surface facing away from the assigned luminescence diode chip. That is to say that the shaped body covers the optical body only at the side surfaces thereof at least in places. The top surface then remains free of the optical body. Electromagnetic radiation possibly emerging at the top surface of the optical body is therefore not converted by the phosphor of the shaped body. In this way, it is possible for the conversion rate, that is to say that proportion of the light emitted by the lighting device which is constituted by the converted radiation, to be set as precisely as possible.

In accordance with at least one embodiment of the lighting device, the at least one optical body terminates flush with the outer surface of the shaped body at its top surface facing away from the assigned luminescence diode chip. In this case, too, the optical body is free of the shaped body at its outer surface facing away from the carrier. The outer surface of the shaped body and the top surface of the optical body form a common surface at which, for example, a further optical body can be arranged.

In accordance with at least one embodiment of the lighting device, the at least one optical body contains a further phosphor, which differs from the phosphor of the shaped body. By way of example, the optical body can then be a ceramic phosphor, that is to say that the optical body then consists of a ceramic phosphor, which converts part of the electromagnetic radiation generated by the assigned luminescence diode chip during operation for example into green, yellow, greenish yellow or red light. Electromagnetic radiation which is not converted in the optical body and passes into the shaped body can be converted at least partly by the phosphor present there. In this case, it is possible for the phosphor of the optical body to generate for example a red light proportion of the radiation emitted by the lighting device during operation, which proportion can increase the color rendering index of the light emitted by the lighting device.

In accordance with at least one embodiment of the lighting device, the side surfaces of the luminescence diode chips are partly or completely covered by a reflective enclosure. The reflective enclosure can also completely cover the mounting surface of the carrier at free surfaces. The reflective enclosure includes a matrix material, for example, into which reflective particles are introduced. In this case, the matrix material can be the same matrix material as that of the shaped body. For example, the reflective enclosure is formed with a silicone or a mixture of a silicone or an epoxide as matrix material into which radiation-reflecting particles are introduced, wherein the radiation-reflecting particles at least consist of one of the materials $TiO_2$, $BaSO_4$, ZnO, $Al_xO_y$, $ZrO_2$ or contain one of the aforementioned materials. The reflective enclosure appears white, for example, to the observer. The reflective enclosure can also be formed with a white polymer. The reflective enclosure terminates for example flush with the radiation exit surface of each of the luminescence diode chips. The shaped body can directly adjoin the reflective enclosure.

In accordance with at least one embodiment of the lighting device, the lighting device includes a radiation-transmissive cover plate, which completely covers the shaped body at its side facing away from the carrier. By way of example, the cover plate can be adhesively bonded onto the shaped body or is connected thereto in a manner free of connecting medium. In the case of a connection free of connecting medium, the cover plate can for example be applied to the not yet fully cured shaped body, such that a mechanically fixed connection between the shaped body and the cover plate arises during the curing of the shaped body. The cover plate can be designed in a radiation-scattering fashion, for example, as a result of which light intermixing of the light emerging from the lighting device during operation can be effected, such that the lighting device during operation emits homogeneously white or colored light via the outer surface of the cover plate facing away from the shaped body.

In accordance with at least one embodiment of the lighting device, the lighting device includes a reflective element, which completely covers the shaped body at its exposed outer surface. If a cover plate is present on that side of the shaped body which faces away from the carrier, the exposed outer surface is formed by the side surfaces of the shaped body extending transversely with respect to the cover plate. These side surfaces, for example, are then covered with a reflective element, such that radiation is guided by reflection to the cover plate. In particular, the reflective element can then ensure that no electromagnetic radiation emerges through side surfaces of the shaped body.

The reflective element can be formed for example by a reflective, for example metallic, coating of the shaped body.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Figure 1:
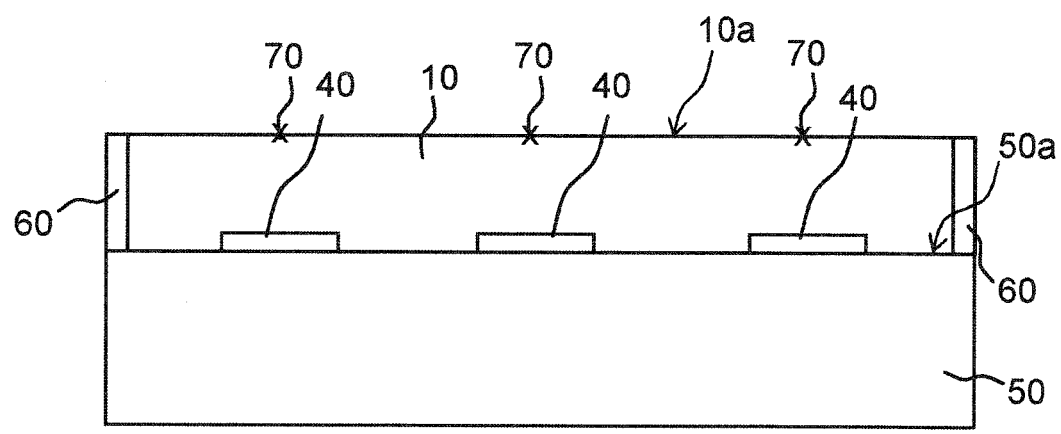
FIG. 1 shows a schematic sectional illustration.

The following detailed description refers to the accompanying drawing that show, by way of illustration, specific details and embodiments in which the disclosure may be practiced. FIG. 1 shows a lighting device in which no optical bodies described here are disposed downstream of luminescence diode chips 40.

FIG. 1 shows a lighting device including a carrier 50 having a mounting surface 50a. The carrier 50 is, for example, a circuit board or a metal-core circuit board.

Luminescence diode chips 40, for example light emitting diode chips that emit UV radiation or blue light, are mechanically fixed and electrically connected to the mounting surface 50a of the carrier 50. By way of example, the luminescence diode chips 40 are adhesively bonded or soldered on for this purpose.

All the luminescence diode chips 40 are enclosed in a positively locking manner at their exposed outer surfaces by a single shaped body 10 and are in direct contact with the shaped body 10. The shaped body 10 includes a phosphor, which wavelength-converts at least part of the electromagnetic radiation generated by the luminescence diode chips 40 during operation.

A particularly high efficiency is achieved as a result of this arrangement of the phosphor in a shaped body 10. Furthermore, a lighting device of this type can be produced easily.

What proves to be problematic, however, is that, during the operation of the lighting device, points or regions of high temperature 70, so-called thermal hot spots, occur, namely at places in the shaped body 10 which are arranged above the luminescence diode chips 40. The increased temperature in the regions 70 leads to a reduced efficiency of the phosphor and to accelerated aging of the material with which the shaped body 10 is formed. As a result of the efficiency of the phosphor being reduced in places in the regions 70, inhomogeneities in the light emergence can furthermore occur at the outer surface 10a of the shaped body 10 facing away from the carrier 50, with the result that the light generated by the lighting device appears as inhomogeneous, for example with regard to color and/or intensity, to the observer. Even a reflective element 60 at the side surface of the shaped body 10, which is designed as a reflective metallic coating, for example, cannot counteract this problem.

One possible solution to the problem described would consist, then, in applying a luminescence conversion element including a phosphor directly to a radiation exit surface of the luminescence diode chips 40. However, this leads to a reduced efficiency compared with the use of a shaped body 10 into which the phosphor is introduced.

In conjunction with FIG. 2, a first embodiment of a lighting device described here is explained in greater detail with reference to a schematic sectional illustration. The lighting device includes a carrier 5. The carrier 5 is a connection carrier, for example, which can be formed by a circuit board, a printed circuit board, a metal-core circuit board or a ceramic main body having structured conductor tracks and/or connection locations.

The carrier 5 includes a mounting surface 5a. Luminescence diode chips 4 are arranged on the mounting surface 5a. The luminescence diode chips 4 are in particular mechanically fixed there and electrically conductively connected to the carrier 5. The luminescence diode chips 4 can be light emitting diode chips. In this case, it is possible for the luminescence diode chips to be luminescence diode chips of identical type which are based on an InGaN material system, for example. Furthermore, it is possible for one or more of the luminescence diode chips 4 to be based on the material system AlGaInP.

The luminescence diode chips 4 are provided for generating UV radiation or visible light during operation. By way of example, some of the luminescence diode chips 4 are designed to generate blue light during operation, and other luminescence diode chips 4 generate differently colored light, for example yellow or red light, during operation.

Overall, the lighting device is designed, for example, to emit white light.

The luminescence diode chips 4 have radiation exit surfaces 4a arranged at that side of the luminescence diode chips 4 which faces away from the carrier 5.

An optical body 2 is arranged at the radiation exit surface 4a of each luminescence diode chip 4. In the embodiment in FIG. 2, all the optical bodies are designed in a transparent fashion at least in places. By way of example, the optical bodies 2 are formed with a glass, a plastics material or a ceramic material. In the exemplary embodiment in FIG. 2, all the optical bodies 2 are embodied in a different form. It is possible, however, for optical bodies 2 having the same form and dimensioning to be disposed downstream of all the luminescence diode chips 4.

By way of example, the lighting device may include at least one optical body 2 which is designed in a parallelepipedal fashion and is enclosed in a positively locking manner by the shaped body 1 including at its top surface 2c facing away from the luminescence diode chip 4. In this case, it is also possible for the optical body 2, as illustrated on the far left in FIG. 2, to have a region 2b designed in a radiation-scattering fashion.

Furthermore, it is possible for the lighting device to include at least one optical body 2 designed in a parallelepipedal fashion, wherein the top surface 2c is free of the shaped body 1. In this case, the top surface 2c can terminate for example flush with an outer surface 1a arranged at that side of the shaped body 1 which faces away from the carrier 5. In this case, the top surface 2c of the optical body 2 is free of the shaped body 1.

Furthermore, it is possible for the lighting device to include at least one optical body 2 which is designed to be triangular in cross section. By way of example, said optical body 2 can be designed in a pyramidal or prismatic fashion. In this case, it is possible for the vertex of the triangle to terminate flush with the outer surface 1a of the shaped body 1.

Figure 2:
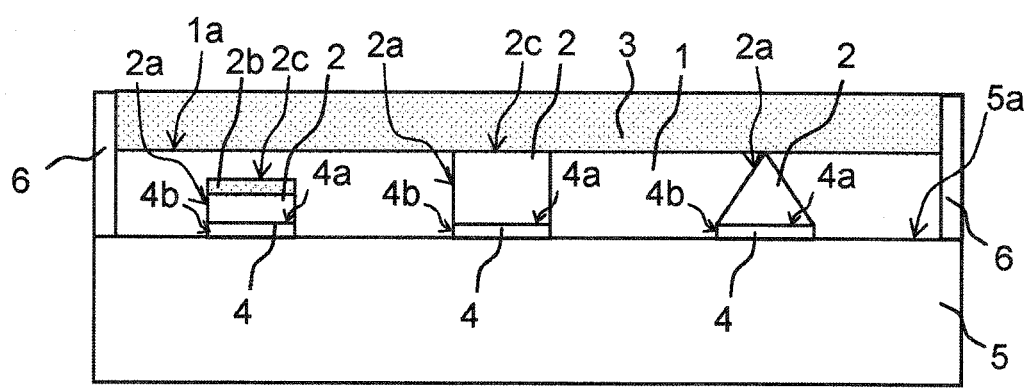
FIG. 2 shows a schematic sectional illustration.

In the embodiment in FIG. 2, the side surfaces 4b of the luminescence diode chips 4 and the side surfaces 2a of the optical bodies 2 are enclosed in a positively locking manner by the shaped body 1 including a matrix material with a phosphor. By way of example, the shaped body 1 is formed with a silicone, an epoxide or a silicone-epoxide hybrid material as matrix material.

The lighting device furthermore includes a cover plate 3, which in the present case is designed in a diffusely radiation-scattering fashion and serves for homogenizing the light emerging from the light device. That is to say that the cover plate 3 serves for light mixing. The cover plate 3 is applied to the outer surface 1a of the shaped body facing away from the carrier 5 and also to the top surface 2c of an optical body and is fixed there for example in a manner free of connecting medium.

The lighting device furthermore includes a reflective element 6, which is designed as a reflective coating on the side surface of the shaped body 1 and the cover plate 3. The reflective element 6 ensures that electromagnetic radiation or light cannot emerge laterally from the lighting device, but rather leaves the lighting device only through the outer surface of the cover plate facing away from the carrier 5.

The optical bodies 2 of the lighting device are applied to the radiation exit surface 4a of the luminescence diode chips 4 for example in a manner free of connecting medium. A large part of the electromagnetic radiation that leaves the luminescence diode chip 4 therefore enters into the optical body 2 assigned to the luminescence diode chip 4.

The optical body 2 or at least the matrix material with which the optical body 2 is formed has a refractive index that is greater than the refractive index of the shaped body 1 or at least of the matrix material of the shaped body 1. By way of example, the optical body 2 can be formed with a high refractive index silicone for this purpose.

Figure 3:
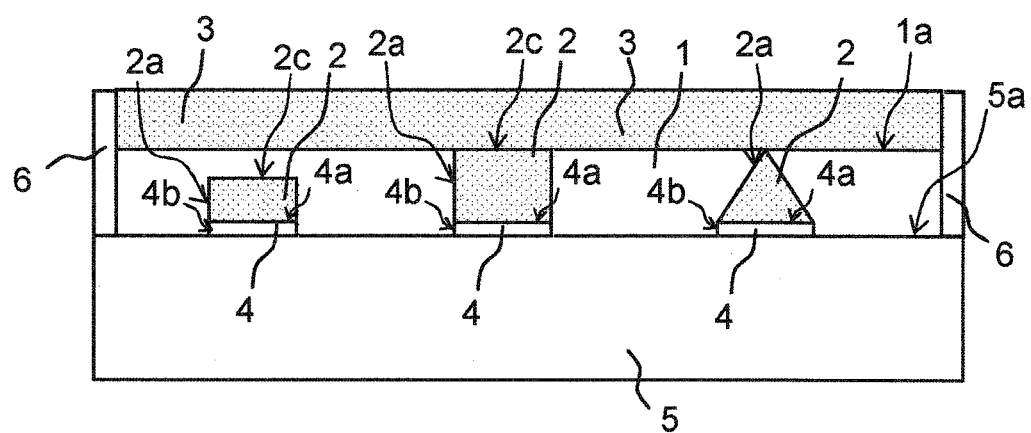
FIG. 3 shows a schematic sectional illustration.

In accordance with the embodiment in FIG. 3, all the optical bodies 2 are designed in a radiation-scattering fashion. For this purpose, the optical bodies 2 can be formed from a ceramic material or with a matrix material, such as a high refractive index silicone, for instance, into which radiation-scattering particles are introduced. By way of example, the radiation-scattering particles are titanium dioxide particles.

In particular, it is possible for the optical bodies 2 and the cover plate 3 to be formed with the same material.

In contrast to the embodiment in FIG. 3, it is also possible here for all the optical bodies 2 to have an identical form and identical dimensions.

Figure 4:
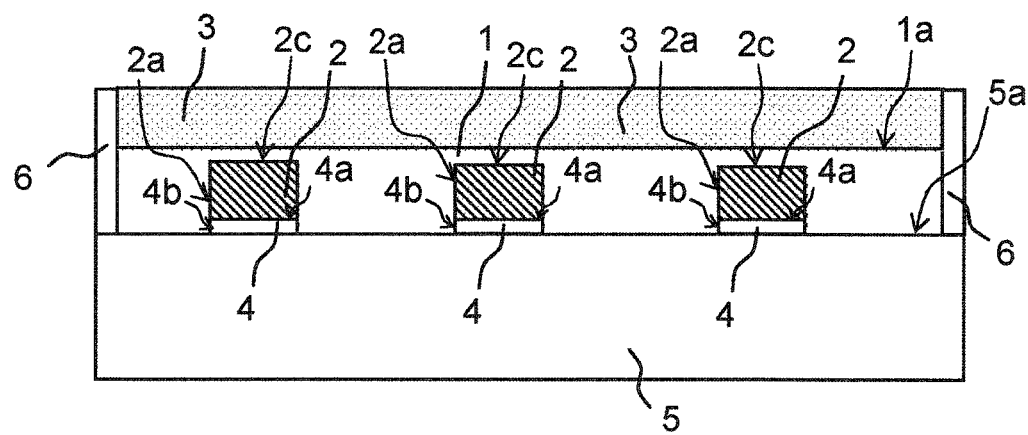
FIG. 4 shows a schematic sectional illustration.

In the embodiment in FIG. 4, all the optical bodies 2 are designed in a radiation-converting fashion. By way of example, the optical bodies 2 can be formed with a matrix material, into which particles of a phosphor are introduced. Furthermore, it is possible for the optical bodies 2 to consist of a ceramic phosphor. By way of example, the phosphor of the optical bodies 2 is a different phosphor than the phosphor of the shaped body 1. For converting blue to green and/or yellow light, for example, it is possible to use the following phosphors: YAG:Ce, LuAG:Ce.

For converting blue light to red light, the following phosphors are appropriate, for example: (Sr,Ba)SiN:Eu, (Sr,Ca)AlSiN:Eu.

For the embodiment in FIG. 4 it advantageously emerges that approximately half of the Stokes shift and thus approximately half of the thermal loading occurs in the optical body 2, and so the thermal loading in the shaped body 1 is reduced by half. If the optical body 2 is in this case formed with a ceramic material, which is generally more thermally stable than silicone, for example, then the lighting device has an improved aging behavior since the matrix material of the shaped body 1, for example silicone, is heated to a lesser extent.

In contrast to the illustration in FIG. 4, the optical bodies 2 can have mutually different forms and dimensions, as is shown for example for the optical bodies in FIGS. 2 and 3. Furthermore, in all the embodiments it is possible for the optical bodies 2 to include a region 2*b* designed in a radiation-scattering fashion. Furthermore, it is possible, in the embodiment in FIG. 4, for the phosphor in the optical body and the phosphor in the shaped body 1 to complement one another in such a way that overall white mixed light is emitted by the lighting device. For this purpose, by way of example, green light can be re-emitted by the phosphor of the optical body 2, whereas red light is re-emitted by the phosphor of the shaped body 1. The re-emitted red and green light then mixes with the blue light of the luminescence diode chips 4 to form white light, which can undergo further light mixing and thus homogenization at the cover plate 3 optionally present.

Figure 5:
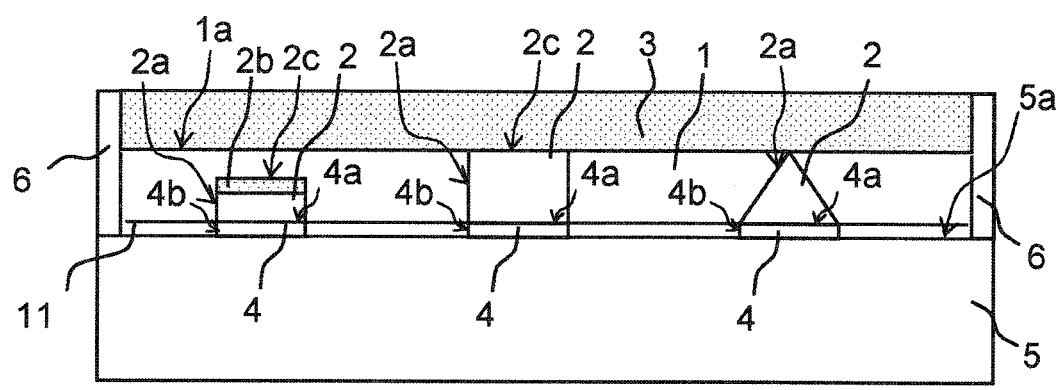
FIG. 5 shows a schematic sectional illustration.

In the embodiment in FIG. 5—in contrast to the embodiment in FIG. 2—the side surfaces 4*b* of the luminescence diode chips 4 are not covered by the shaped body 1. Instead of being covered by the shaped body 1, the side surfaces 4*b* of the luminescence diode chips 4 are covered by a reflective enclosure 11, which can also completely cover the mounting surface 5*a*. The reflective enclosure 11 includes, for example, a matrix material into which reflective particles are introduced. In this case, the matrix material can be the same matrix material as that of the shaped body. For example, the reflective enclosure is formed with a silicone or a mixture of a silicone or an epoxide as matrix material into which radiation-reflecting particles are introduced, wherein the radiation-reflecting particles at least consist of one of the materials $TiO_2$, $BaSO_4$, $ZnO$, $Al_xO_y$, $ZrO_2$ or contain one of the aforementioned materials. The reflective enclosure 11 appears white, for example, to the observer. The reflective enclosure terminates for example flush with the radiation exit surface 4*a* of each of the luminescence diode chips 4.

A reflective enclosure 11 as shown in FIG. 5 can be used in all the embodiments in FIGS. 2 to 4.

A lighting device described here is distinguished in particular by an improved thermal behavior and a reduced susceptibility to aging.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A lighting device comprising:
   a carrier having a mounting surface,
   at least one luminescence diode chip having, at its side facing away from the carrier, a radiation exit surface, through which electromagnetic radiation generated in the luminescence diode chip during operation emerges at least partly,
   at least one optical body designed in a radiation-transmissive fashion, and
   a shaped body comprising a phosphor, wherein
   each luminescence diode chip is fixed to the mounting surface on the carrier,
   each of said at least one optical body is fixed to the radiation exit surface of an assigned luminescence diode chip,
   the shaped body encloses each optical body in a positively locking manner at a side surface of the optical body, and
   the phosphor converts at least part of the electromagnetic radiation generated in at least one of the luminescence diode chips during operation, wherein at least one of the at least one optical body is free of the shaped body at its top surface facing away from the assigned luminescence diode chip.

2. The lighting device as claimed in claim 1, wherein the shaped body encloses each luminescence diode chip in a positively locking manner at a side surface of the luminescence diode chip.

3. The lighting device as claimed in claim 1, wherein an optical body of said at least one optical body is assigned one-to-one to each luminescence diode chip.

4. The lighting device as claimed in claim 1, further comprising at least two optical bodies which differ from one another in terms of form and/or material composition.

5. The lighting device as claimed in claim 1, wherein at least one of the at least one optical body is designed in a transparent fashion at least in places.

6. The lighting device as claimed in claim 1, wherein at least one of the at least one optical body is designed in a radiation-scattering fashion at least in places.

7. The lighting device as claimed in claim 1, wherein at least one of the at least one optical body is designed in a hemispherical, lens-shaped, pyramidal or prismatic fashion.

8. The lighting device as claimed in claim 1, wherein at least one of the at least one optical body terminates flush with an outer surface of the shaped body at its top surface facing away from the assigned luminescence diode chip.

9. The lighting device as claimed in claim 1, wherein at least one of the at least one optical body contains a further phosphor, which differs from the phosphor of the shaped body.

10. The lighting device as claimed in claim 1, wherein each of the at least one optical body has exclusively planar boundary surfaces that terminate the optical body toward the outside.

11. The lighting device as claimed in claim 1, further comprising a radiation-transmissive cover plate, which completely covers the shaped body at its side facing away from the carrier.

12. The lighting device as claimed in claim 1, further comprising a reflective element, which completely covers the shaped body at its exposed outer surface.

13. The lighting device as claimed in claim 1, wherein the at least one optical body has a higher optical refractive index than the surrounding material of the shaped body.

14. The lighting device as claimed in claim 1, wherein a reflective enclosure encloses each luminescence diode chip in a positively locking manner at a side surface of the luminescence diode chip.

15. A lighting device comprising:
    a carrier having a mounting surface,
    at least one luminescence diode chip having, at its side facing away from the carrier, a radiation exit surface, through which electromagnetic radiation generated in the luminescence diode chip during operation emerges at least partly, at least one optical body designed in a radiation-transmissive fashion, and a shaped body comprising a phosphor, wherein each luminescence diode chip is fixed to the mounting surface on the carrier, each of said at least one optical body is fixed to the radiation exit surface of an assigned luminescence diode chip, the shaped body encloses each optical body in a positively locking manner at a side surface of the optical body, and the phosphor converts at least part of the electromagnetic radiation generated in at least one of the luminescence diode chips during operation, wherein at least one of the at least one optical body contains a further phosphor, which differs from the phosphor of the shaped body.

16. A lighting device comprising:

a carrier having a mounting surface, at least one luminescence diode chip having, at its side facing away from the carrier, a radiation exit surface, through which electromagnetic radiation generated in the luminescence diode chip during operation emerges at least partly, at least one optical body designed in a radiation-transmissive fashion, and a shaped body comprising a phosphor, wherein each luminescence diode chip is fixed to the mounting surface on the carrier, each of said at least one optical body is fixed to the radiation exit surface of an assigned luminescence diode chip, the shaped body encloses each optical body in a positively locking manner at a side surface of the optical body, and the phosphor converts at least part of the electromagnetic radiation generated in at least one of the luminescence diode chips during operation, wherein the at least one optical body has a higher optical refractive index than the surrounding material of the shaped body.

17. The lighting device as claimed in claim 16, wherein the shaped body encloses each luminescence diode chip in a positively locking manner at a side surface of the luminescence diode chip.

18. The lighting device as claimed in claim 16, wherein an optical body of said at least one optical body is assigned one-to-one to each luminescence diode chip.

19. The lighting device as claimed in claim 16, further comprising at least two optical bodies which differ from one another in terms of form and/or material composition.

20. The lighting device as claimed in claim 16, wherein at least one of the at least one optical body is designed in a transparent fashion at least in places.

* * * * *